United States Patent [19]

Rozman

[11] Patent Number: 4,808,918

[45] Date of Patent: Feb. 28, 1989

[54] WATTHOUR METER COMPRISING A HALL SENSOR AND A VOLTAGE-FREQUENCY CONVERTER FOR VERY LOW VOLTAGES

[75] Inventor: Miro Rozman, Bled, Yugoslavia

[73] Assignee: Iskra-Sozd Elektrokovinske Industrije n.sol.o., Ljubljana, Yugoslavia

[21] Appl. No.: 36,772

[22] Filed: Apr. 9, 1987

[30] Foreign Application Priority Data

Apr. 9, 1986 [YU] Yugoslavia .............................. 564/86
Feb. 12, 1987 [YU] Yugoslavia .............................. 209/87

[51] Int. Cl.$^4$ ...................... G01R 21/08; G01R 15/10
[52] U.S. Cl. ................................. 324/142; 324/117 H; 324/130; 324/132
[58] Field of Search ................... 324/117 H, 142, 132, 324/130; 364/483, 571, 573; 328/165

[56] References Cited

U.S. PATENT DOCUMENTS 4,327,416 4/1982 Jerrim ............................ 324/117 H

FOREIGN PATENT DOCUMENTS 3243258 5/1984 Fed. Rep. of Germany ... 324/117 H

*Primary Examiner*—Ernest F. Karlsen
*Attorney, Agent, or Firm*—Fleit, Jacobson, Cohn & Price

[57] ABSTRACT

A watthour meter having a Hall component in a sensor circuit connected to a low voltage type of voltage-to-frequency converter, achieves linear signal conversion of the voltage output from the sensor circuit with maximum polarity reversal of the Hall voltage by synchronizing such polarity reversal with polarity reversal across an integration capacitor of the converter so that the amplified offset voltage produced by the integration operation and the effects of capacitor instability compensate for each other.

18 Claims, 6 Drawing Sheets

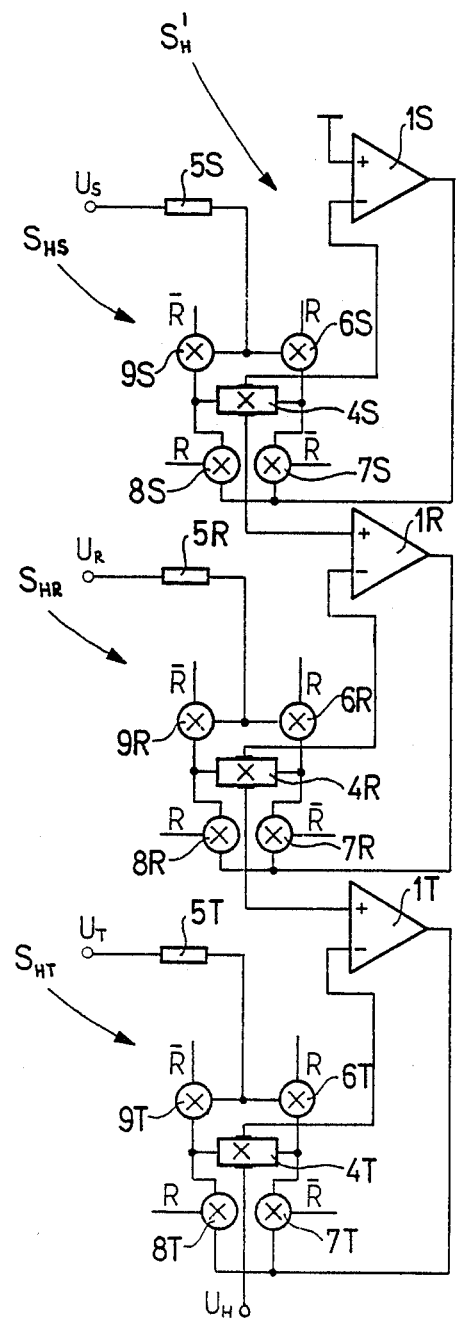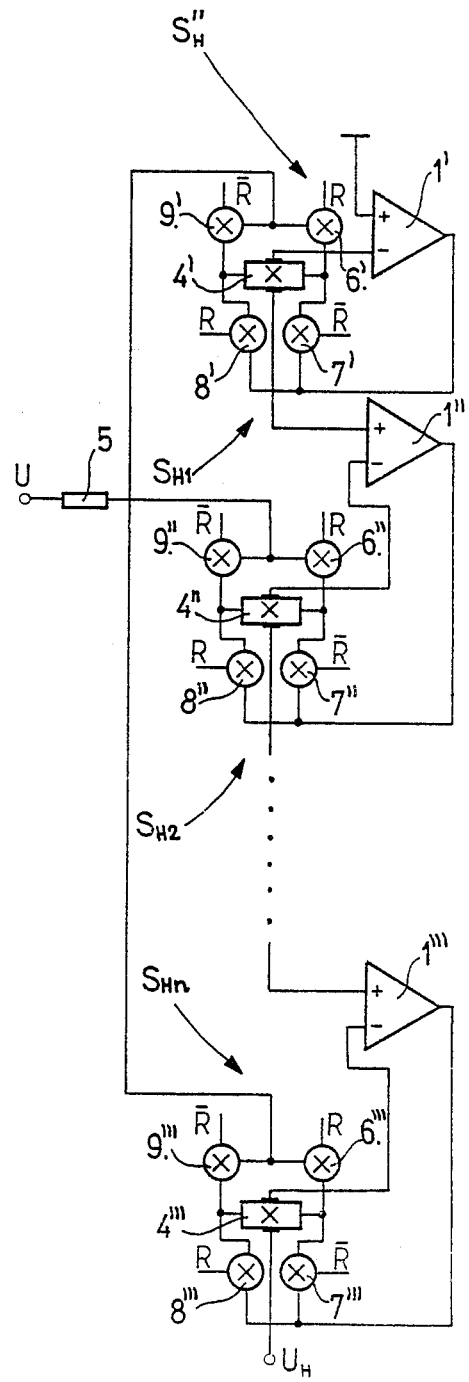
Fig.7
Fig.8

WATTHOUR METER COMPRISING A HALL SENSOR AND A VOLTAGE-FREQUENCY CONVERTER FOR VERY LOW VOLTAGES

BACKGROUND OF THE INVENTION

This invention relates to a watthour meter for very low voltages.

In analog-digital watthour meters precise linearity is required for the conversion of the sensor circuit output voltage into frequency. This requirement appears to be particularly compelling at very low output voltages of the Hall sensor and, additionally, in a wide measuring range.

In certain prior art voltage-frequency converters the influence of the offset voltage of the integrating operational amplifier is reduced by reversing the sign of the input voltage of the integrator, and the influence of the integrating capacitor is removed by applying an accurately determined compensation impulse. The conversion inaccuracy originating from the input voltage of said amplifier remains because of unequal periods of the application of differently polarized voltages. Consequently, such a converter is not suitable for low input voltages, especially for a wide measuring range. A further disadvantage consists in a considerable influence of the integrator loss angle when the amplification of the operational amplifier is restricted.

SUMMARY OF THE INVENTION

In accordance with the present invention the influence of the offset of the integrating amplifier in the aforementioned converter of a watthour meter and the influence of instability of the integrating capacitor is entirely eliminated by mutual compensation. Hall sensor circuit is also provided generating the largest possible polarity reversal for its output voltage.

Specific embodiments of the invention will be presented in the following detailed description in conjunction with the accompanying drawings.

DETAILED DESCRIPTION

Figure 1:
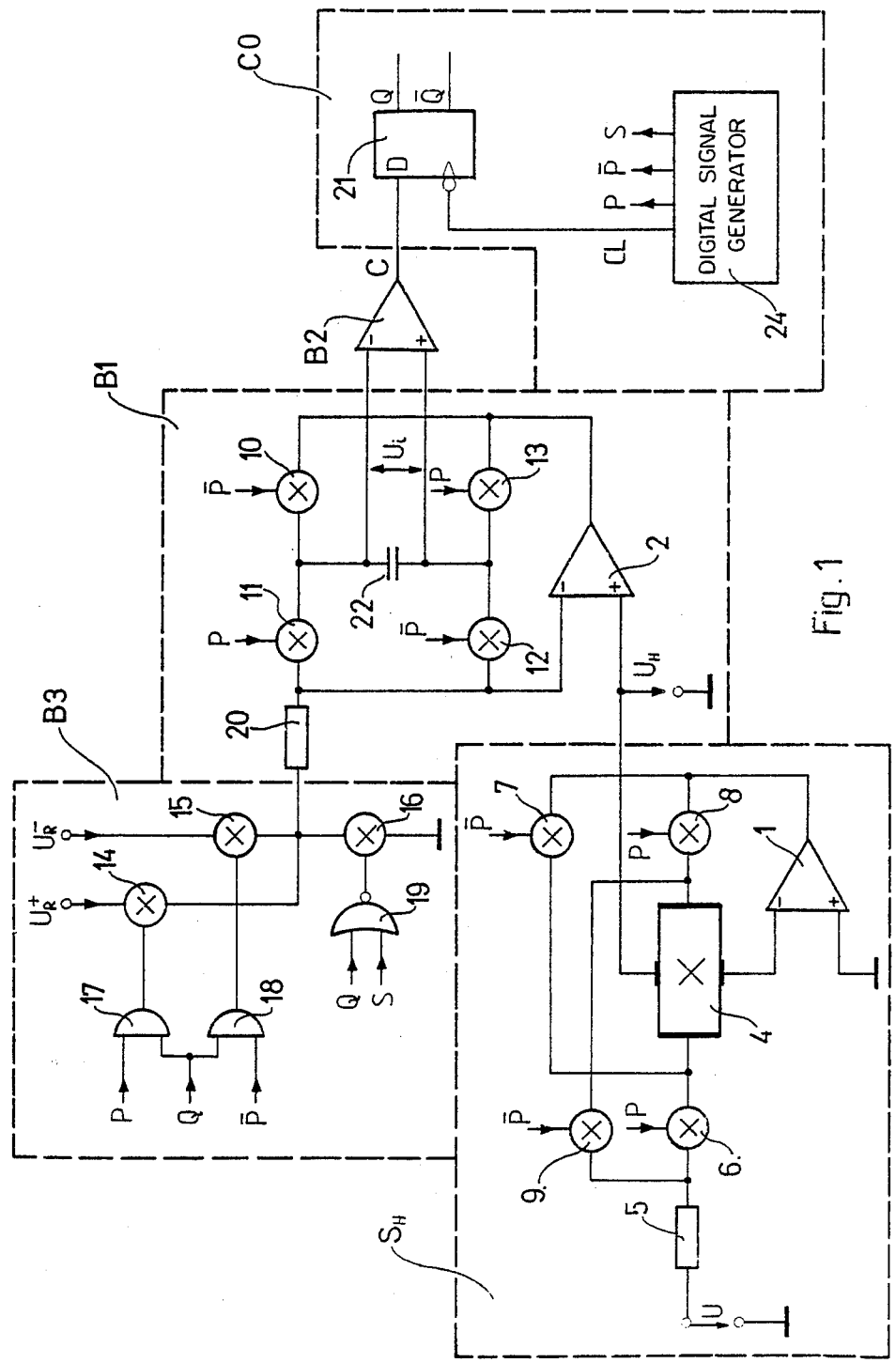
FIG. 1 is a circuit diagram of the basic watthour meter embodiment of the invention.

The watthour meter in accordance with the fundamental embodiment of the invention includes a sensor circuit $S_H$, an integrator B1, a comparator B2, a control circuit CO and a compensation circuit B3 (FIG. 1).

The input terminal of the circuit $S_H$ and the output of an operation amplifier 1, are interconnected in series by a resistor 5, a switch 6, a Hall sensor 4 and a switch 8. The switch 6 and the sensor 4 are shunted by a switch 9, while the sensor 4 and the switch 8 are shunted, by a switch 7. The switches 6,8 are controlled by a sign reversing signal P, the switches 7,9, however, by a sign reversing signal $\overline{P}$. The noninverting input of the amplifier 1 is mass connected and the inverting input is connected to the first voltage terminal of the sensor 4, whose second voltage terminal is connected to the output terminal of the circuit $S_H$.

To the output of an integrating operational amplifier 2, to whose noninverting input the output of the circuit $S_H$ is connected, there are series connected a switch 13, an integrating capacitor 22, a switch 11 and a resistor 20. The switch 13 and the capacitor 22 are shunted by a switch 10, while the capacitor 22 and the switch 11 are shunted by a switch 12. The switches 11,13 are controlled by the signal P and the switches 10,12 by the signal $\overline{P}$. A common terminal of the switches 11,12 and of the resistor 20 is connected to the inverting input of the amplifier 2.

The inputs of the comparator B2 are connected to the terminals of the capacitor 22. From the output of the comparator B2 a comparator signal C is conducted to the D-input of a D-flipflop in the control circuit CO. A clock signal CL, generated e.g. in a crystal oscillator, of a digital signal generator 24 is fed to the clock input of the flipflop 21.

In the digital signal generator 24 forming part of the control circuit CO as shown in FIG. 1, there are also generated the aforementioned switch controlling signals P, $\overline{P}$, their period being a multiple of the period of the signal CL, and a short signal S, being either logic 0 or logic 1 between successive signals P, $\overline{P}$. A compensation signal Q appears on the Q-output of the flipflop 21.

In the circuit B3, terminals for reference voltages $U_R^+$, $U_R^-$ are connected to a common terminal of the resistor 20 and of the switch 16, which is mass connected, through switches 14 and 15, resp. The signals P, $\overline{P}$ are conducted to one input of each AND gate 17,18 and the signal Q is conducted to a common point of the gates 17,18. The output signals of the gates 17,18 control the switches 14,15. The switch 16, however, is controlled by the output signal of a NOR gate 19, to whose inputs signals Q, S are applied.

To the input terminal of the sensor circuit $S_H$ there is applied the voltage U across the circuit whose energy consumption is being measured by the watthour meter. The magnetic induction thereby occurring in the Hall sensor 4 is proportional to the electric current conducted in said circuit. Accordingly, the output voltage $U_H$ of the circuit $S_H$ is proportional to the electric power consumed by the measured circuit.

Figure 2:
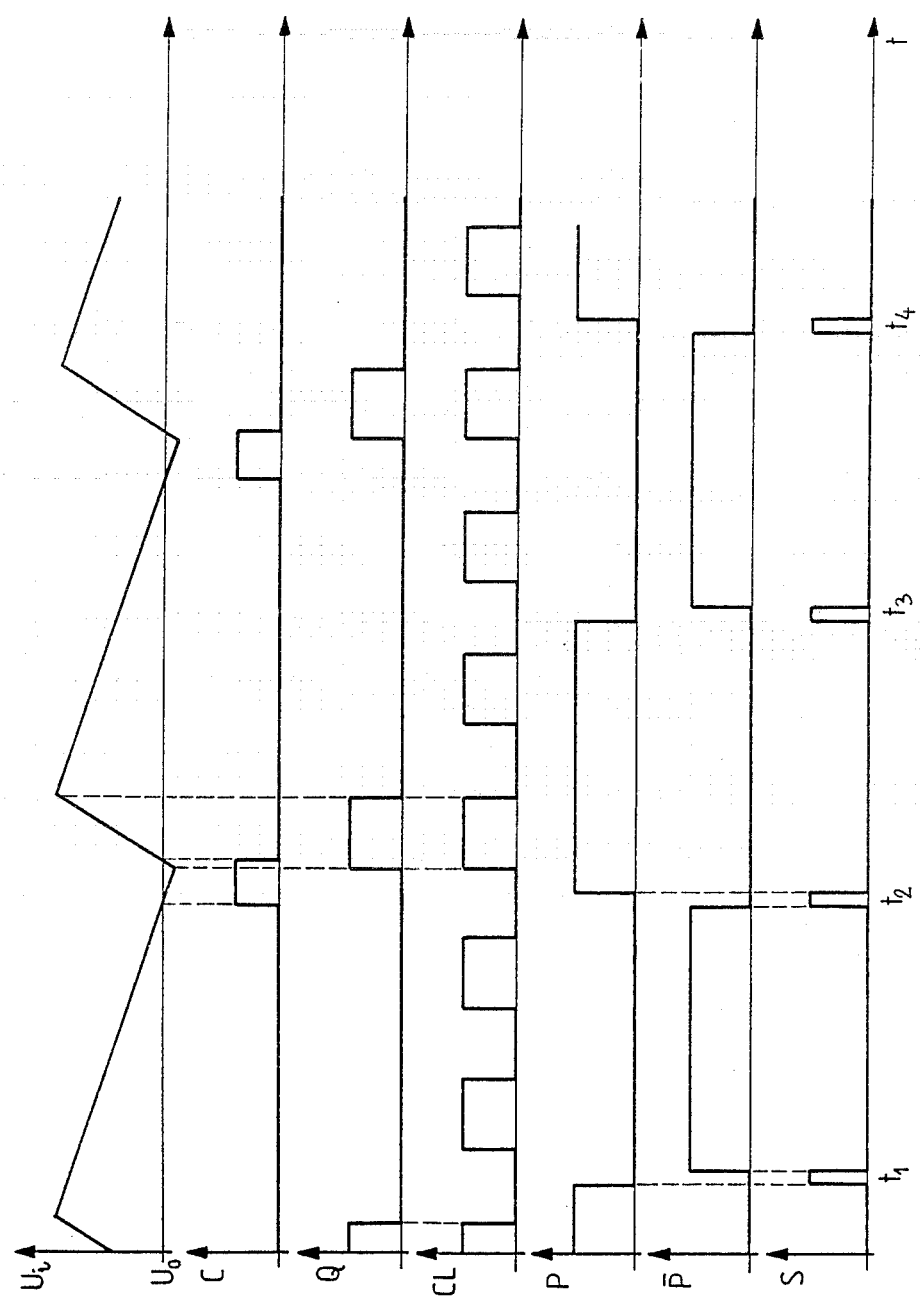
FIG. 2 is a graphical illustration of the time behaviour of an integrated voltage $U_i$ and of control signals for the circuit of FIG. 1.

The operation of said watthout meter will be described with reference to FIGS. 1 and 2. The polarity reversal of the output voltage $U_H$ of the circuit $S_H$ coincides with the sign reversal of the terminals of the capacitor 22 of integrator B1. The integrated voltage $U_i$ across the capacitor 22 therefore decreases steadily to a threshold level $U_o$ of the comparator B2 as shown in FIG. 2, whereupon the signal C appears at the comparator output. The digital signal generator 24 generates the signals P,P of equal duration, i.e. $t_2 - t_1 = t_3 - t_2$. Just for this reason the affects of the offset voltage of the amplifier 2 and of the instability of the integrated voltage $U_i$ across capacitor 22 cancel each other. The first impulse CL after the appearance of signal C triggers flipflop 21 to produce an impulse signal Q. By controlling switches 14,15 of the compensation circuit B3 the charge compensation from the two reference sources of voltages $U_R$ and $U_R$ is synchronized with the reversing of the terminal polarity of the capacitor 22. The resistor 20 is grounded through the switch 16 as shown, except during the logic impulses Q and during the impulses S, whereby any current otherwise conducted to the amplifier 2 is prevented when the terminals of the capacitor 22 are reversed.

Figure 3:
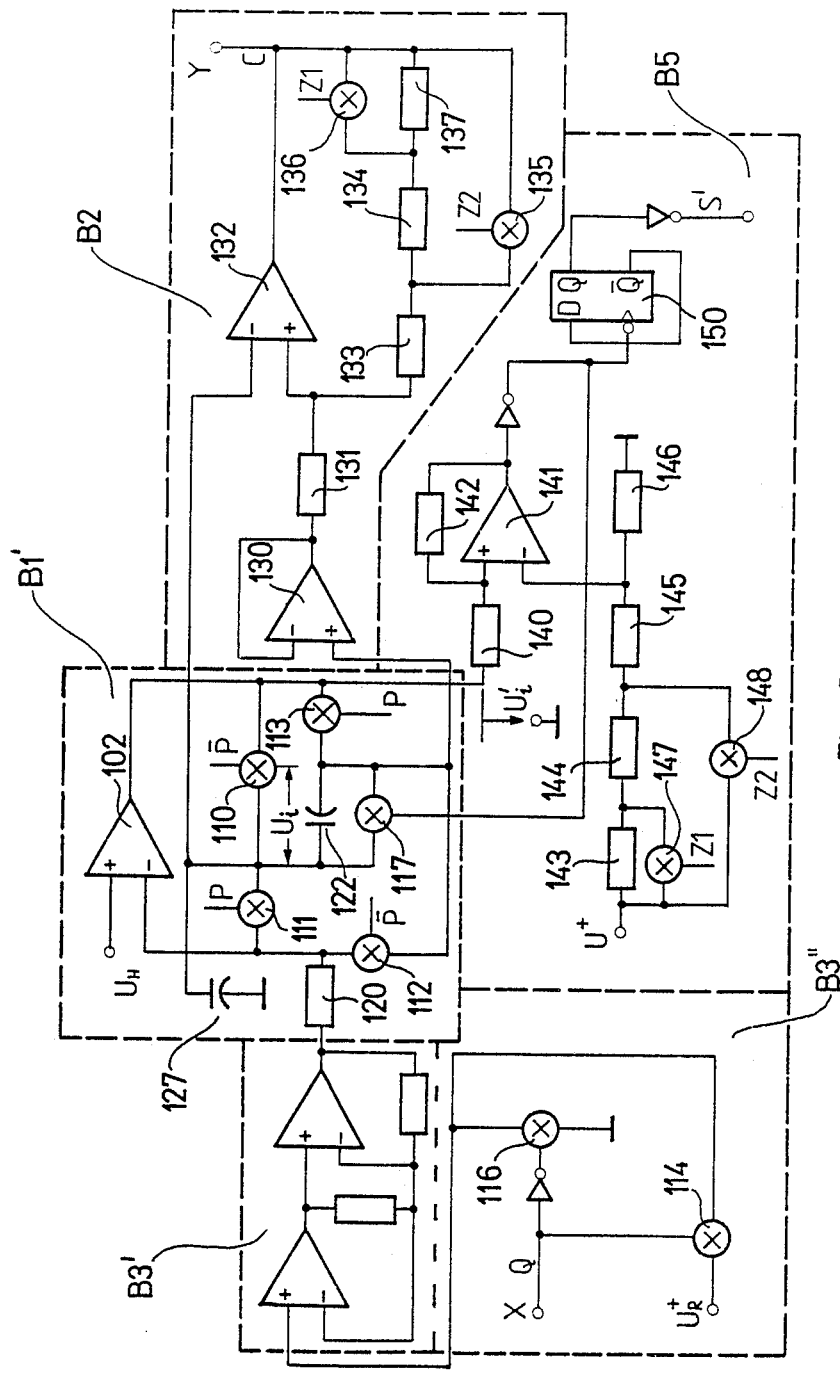
FIGS. 3, 4 is a circuit diagram of another watthour meter embodiment of the invention.
Figure 4:
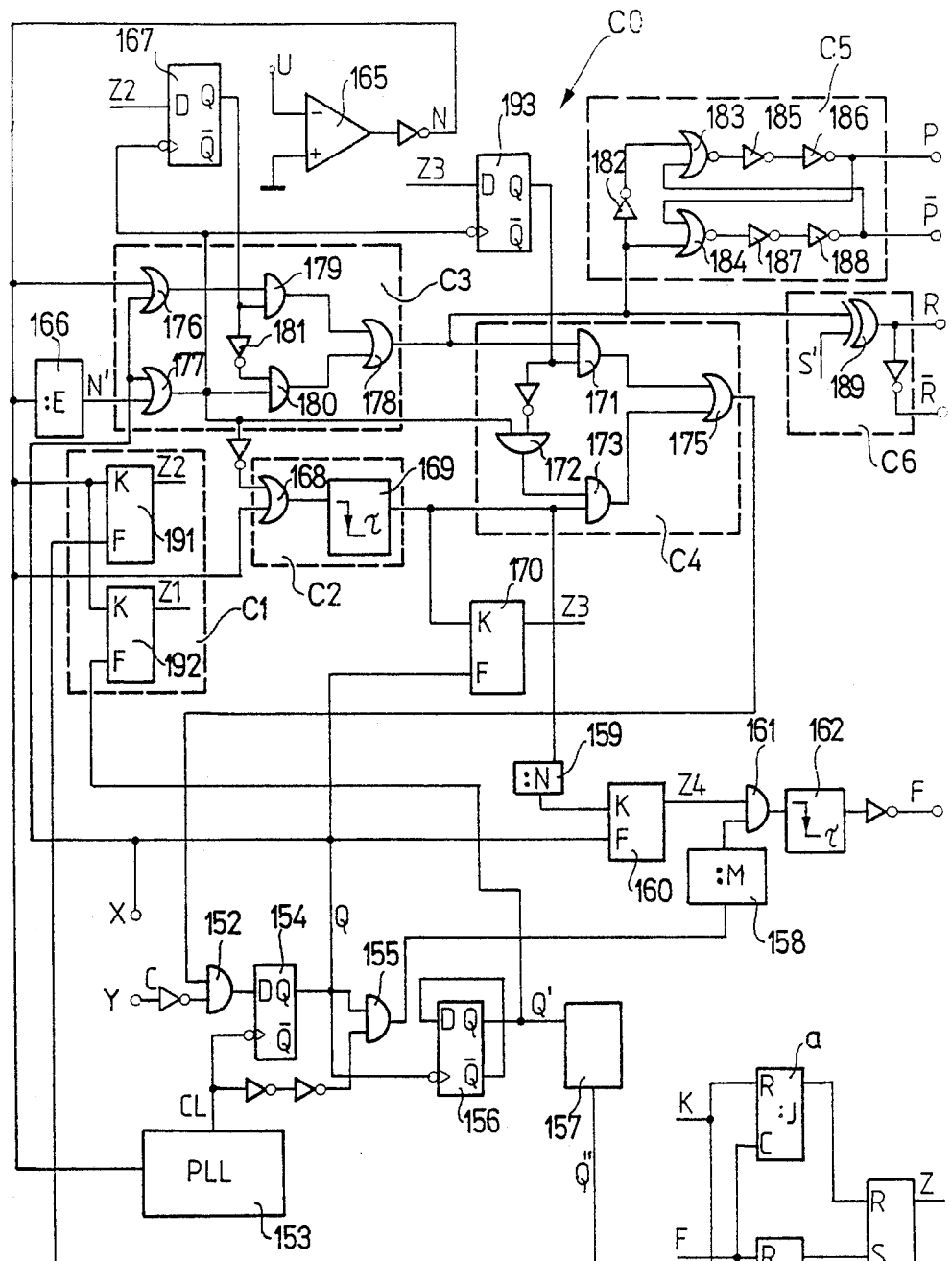

A further watthour embodiment of the invention includes the sensor circuit $S_H$ connected to the input of an integrator B1'; a comparator B2'; compensation circuits B3' and B3'' and a detector B5 as shown in FIG. 3. A control circuit CO as shown in FIG. 4 is associated with this embodiment.

The comparator B2 is provided with a follower amplifier configuration in which the noninverting input of an operational amplifier 130 is connected to a terminal of an integrating capacitor 122 in the integrator B1, while the other terminal of the capacitor 122 is connected to a capacitor 127, whose other terminal is grounded, and to the inverting input terminal of an operational amplifier 132. The amplifier 132 produces at its output the output signal C' of comparator B2'. The amplifier 132 with feedback resistors 133, 134, 137 and with a resistor 131, connecting the output of the amplifier 130 to its noninverting input, forms a Schmitt trigger. By shunting individual feedback resistors 134 and 137 by means of switches 135, 136 controlled by signals Z1, Z2, various high and low threshold levels $U_{Hn}$, $U_{Ln}$ are established for the comparator B2'.

The circuit B3 is provided with a single reference terminal $U_R+$ to which a switch 114 controlled by a signal $Q_1$ is connected. The other terminal of the grounded switch 114 is connected to a switch 116, controlled by the inverted signal $Q_1$, and the input of a follower amplifier B3', whose output is connected to resistor 120 of the integrator B1'.

The detector B5 is provided with an operational amplifier 141. To its noninverting input there are coupled a feedback resistor 142 and a resistor 140 connected to the output of an amplifier 102 in the integrator B1'. To the inverting input of the amplifier 141, a chain of resistors 143-146 is connected. One end of this chain is connected to an energizing voltage terminal U+ while the other end is grounded. Individual resistors 143 and 144 may be respectively shunted by switches 147, 148 which are controlled by signals Z1, Z2. In this manner a single threshold level of the detector B5 is established. The inverted output signal of the amplifier 141 is applied to the control terminal of a switch 117 bridging the capacitor 122, and to the clock input of a flipflop 150. The D-input of the flipflop 150 and its $\overline{Q}$-output are interconnected. At the Q-output of the flipflop 150 an inverted signal S' is established.

The inverted comparator signal C' of comparator B2' is applied to an AND gate 152 in the control circuit CO' as shown in FIG. 4. The output signal of a multiplexer C4 is applied to the other input of the gate 152. The output of the gate 152 is connected to the D-input of a D-flipflop 154, to whose clock input a clock signal CL is applied from a phase locked loop circuit 153. To the input of the circuit 153 a signal N is applied, which is the inverted output signal of a zero detector 165 to which mains voltage is applied. At the Q-output of the flipflop 154, a signal Q is generated and applied to a signal terminal X of the circuit B3'' shown in FIG. 3, to the input of a multiplexer C3 shown in FIG. 4 and to the clock input of a D-flipflop 156. The $\overline{Q}$-output of the flipflop 156 is connected to the D-input. At its A-output of flipflop 156 a signal Q' is generated and applied to the input of a frequency divider 157, whose output signal Q'' and the signal Q' are applied to the input of a frequency comparator C1.

Figure 5:
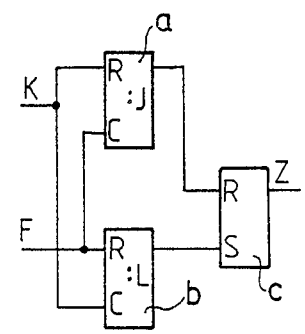
FIG. 5 is a circuit diagram of a (K,F;Z) frequency comparator.

The frequency comparator C1 is provided with two (K,F;Z) frequency comparator sections 191, 192. The circuit of each comparator section is represented in FIG. 5. It is assembled with two frequency dividers a, b with a division ratio J and L, resp. The reset input of the divider a is connected to the count input of the divider b and represents the K-input of the comparator section. The reset input of the divider b is connected to the count input of the divider a and represents the F-input of the comparator section. The outputs of the dividers a, b are connected to the R-input and to the S-input, resp., of an RS-flipflop c, whose output represents the Z-output of the comparator section. To the K-inputs of the comparator section 191, 192 the signal N is applied, while to the F-inputs signals Q', Q'' are applied. The signal Z1 at the output of the comparator section 192 flips from logic 0 to logic 1 when the frequency of the signal Q' exceeds the frequency of the signal N, just as the signal Z2 flips to logic 1 when the frequency of the signal Q'' exceeds the frequency of the signal N.

To one input of each OR gate 176, 177 of the multiplexer C3 shown in FIG. 4, a signal Q is applied, while the other input of the gate 176 has the signal N applied. To the other input of the gate 177 a signal N' is applied. The signal N' is generated by a frequency divider 166 having an input to which the signal N is applied. The output of the gate 177 is connected to the input of an AND gate 180 and to the clock input of a D-flipflop 167, to whose D-input the signal Z2 is applied. The Q-output of the flipflop 167 is connected to an input of an AND gate 179, to whose other input the output of the gate 176 is connected, and through an inverter 181 to the other input of the gate 180. The outputs of the gates 179, 180 are connected to the inputs of an OR gate 178, at whose output the output signal of the multiplexer C3 appears. The frequency of this output signal is equal to the frequency of the signal N or of the signal N' depending on the state of the signal Z2. From the output signal of the multiplexer C3 polarity reversing signals P', $\overline{P}'$ are derived through circuit C5.

The circuit C5 for the generation of the signals P', $\overline{P}'$ is provided with a chain formed by a NOR gate 184, to whose output there are series connected inverters 187, 188. A second chain is formed by a NOR gate 183, to whose output there are series connected inverters 185, 186. An input of the gate 184 is connected to the input of an inverter 182, whose output is connected to an input of the gate 183, as well as to the output of the multiplexer C3. The other two inputs of the gates 183, 184 are connected to the outputs of the inverters 188, 186, wherefrom the signals P', $\overline{P}'$ are taken. A circuit C6 for the generation of signal R, $\overline{R}$ is provided with an exclusive OR gate 189, to whose first input the output of the multiplexer C3 is connected and to its second input the signal S' is applied. At the output of the gate 189 a signal R and an inverted signal $\overline{R}$ appear.

The formation of the signal $Q_1$, involves the output signal from the multiplexer C4 to be described. The inverted output signal of the gate 177 of circuit C3 and the inverted signal N from the zero detector 165 are applied to an OR gate 168, whose output is connected to the input of a monoflop 169. The output of the monoflop 169 is connected to an input of the AND gate 173 and to the K-input of a (K,F; Z) frequency comparator 170, to whose F-input the signal $Q_1$ is applied and at whose output a signal Z3 appears. The output of the monoflop 169 is also connected to a frequency divider 159, to whose output there is connected a circuit for the generation of an output impulse F of the watthour meter. The signal Z3 is applied to the D-input of a D-flipflop 193, whose clock input is connected to the output of the gate 177. A signal from the Q-output of the flipflop 103 is applied to an input of an AND gate 171, to whose second input the output of the gate 178 is connected, while an inverted Q signal if applied to an input of an AND gate 172, to whose second input there is connected the output of the gate 177. The output of the gate 172 is connected to the second input of the gate 173. The outputs of the gates 171, 173 are connected to the inputs of an OR gate 175, at whose output the output signal of the multiplexer C4 appears in a state depending on the signal Z3. The impulses of the signal $Q_1$ appear only during the active periods of the signals P'; hence during the active periods of the signals P' no compensation takes place. Such purposeful operational procedure makes possible a single reference voltage terminal.

Figure 6:
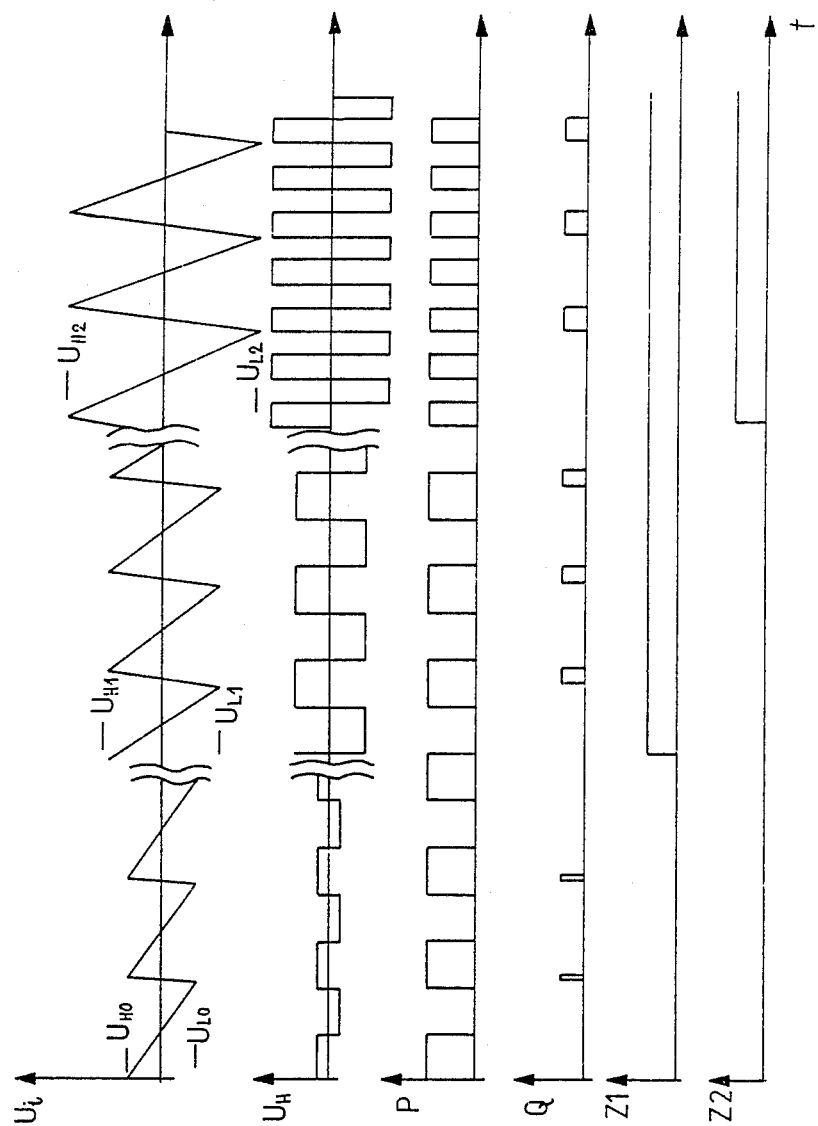
FIG. 6 is a graphical illustration of the time behaviour of an integrated voltage $U_i$, of an output voltage $U_H$ of the sensor circuit, of control signals, and of threshold levels for three different voltage amplitudes $U_H$, all together for the circuit of FIGS. 3, 4, and FIGS. 7, 8 are two sensor circuit embodiments.

The operation of the foregoing watthour meter embodiment of the invention is graphically illustrated by FIG. 6. The first third of the time axis represents the period of low output voltage $U_H$ of the sensor circuit $S_H$. Both output signals Z1, Z2 of the comparator C1 are at logic 0, whereby low threshold levels $U_{HO}$, $U_{LO}$ of the Schmitt trigger in the comparator B2 are defined. Despite the low voltage $U_H$, an appropriate sign reversing frequency $f_O$ is thereby achieved and in this way the influence of the offset voltage and of the instability of the capacitor 122 is eliminated. At higher output voltages higher threshold levels $U_{Hn}$, $U_{Ln}$ are established The frequency $f_O$ remains approximately constant in the whole measuring range. By the frequency $f_O$ and by a loss resitance $R_L$ of the integrator, the capacity $(1/f_O R_L)$ of the capacitor 127 is determined which additionally compensates for the loss angle of the integrator B1'.

When the energy consumed at the terminals of the measured circuit is directed in such a manner that the voltage $U_i'$ starts to increase in a positive direction, the $U_i'$ behaviour is tracked by the detector B5 as soon as the voltage $U_i'$ at the output of the amplifier 102 for the first time exceeds the threshold level of the detector B5. A single detector threshold level is sufficient since the sign of the voltage $U_i$ is changed in synchronism with the signal P. Then the capacitor 122 is shunted by a switch 117. In the detector B5 the signal S' appears at detector B5 through which in the circuit C6 produces the signals for controlling switches in the sensor circuit $S_H$ in order to transform the signals P', $\overline{P}'$ into the signals R, $\overline{R}$.

An embodiment of a sensor circuit $S_H'$ of the invention for a three-phase watthour meter is shown in FIG. 7. The circuit $S_H'$ is composed by circuit sections $S_{HS}$, $S_{HR}$, $S_{HT}$, which correspond to the circuit $S_H$. To input terminals $U_S$, $U_R$, $U_T$ appropriate phase voltages are connected and the noninverting input of an amplifier 1S is grounded. The output of the circuit section $S_{HS}$ is connected to the noninverting input of an amplifier 1R in the circuit section $S_{HR}$. The output of the circuit section $S_{HR}$ is connected to the noninverting input of an amplifier 1T. The output of the circuit section $S_{HT}$ is also the output of the circuit $S_H'$.

An embodiment of a sensor circuit $S_H''$ (FIG. 8) of the invention is used in an attempt to obtain an enhanced sensor output voltage $U_H''$, as compared to the output voltage $U_H$ of the circuit $S_H$. Sensor circuit section $S_{H1}$, $S_{H2}$ ... $S_{Hn}$ are cascade connected as hereinbefore described in the circuit $S_H'$, having, however, a common resistor 5.

An advantage of the watthour meter according to the invention exists preventing non-linear conversion in the voltage-frequency converter because of the offset voltage of the integrating operational amplifier and the instability of the integrating capacitor. Further advantages exist in that the meter according to the invention is applicable in a wide measuring range and that the circuit capable of being constructed by monolithic technology, including the cascading of several monolithic sensor circuits with the Hall sensor.

What is claimed is:

1. In a watthour meter comprising a sensor circuit having an input terminal and a Hall sensor providing an output voltage $U_H$ proportional to energy measured at the input terminal and a voltage-frequency converter for conversion of said output voltage, including an integrator having a first operational amplifier connected to the sensor and a capacitor with opposite terminals, a compensation circuit, a coupling resistor connecting the compensation circuit to the integrator supplying thereto a compensating charge, a comparator having an output and a pair of inputs connected to said terminals of the capacitor and a control circuit connected to the output of the comparator, the improvement residing in said sensor circuit ($S_H$, $S_H'$, $S_H''$) further including two pairs of controlled switches (6,7) and (8,9), an input resistor (5) connected to one of the switches (6,9) of each of said two pairs, and a second operational amplifier (1) having an inverting input, a noninverting input and an output connected to the other of the switches (7,8), said integrator further including two pairs of controlled switches (10,11;110,111) and (12,13;112,113) respectively connected to the terminals of the capacitor (22;122), one of the switches (10,13;110,113) of each of the two pairs of the switches of the integrator being connected to the output of the second operational amplifier (2;102), the other of the switches (11,12;111,112) of the integrator being connected to the inverting input of the second operational amplifier (2;102) and to the coupling resistor (20;120), said control circuit including means producing polarity reversing signals (P, P', $\overline{P}$, $\overline{P}'$, R, $\overline{R}$) for controlling the switches (6,8) and (7,9) of the sensor circuit and the switches (11,13;111,113) and (10,12;110,112) of the integrator.

2. Watthour meter as recited in claim 1, characterized in that a signal (C) at the output of the comparator (B2) turns over to logic 1 as the voltage ($U_i$) on the capacitor (22) during integration drops to the threshold level of the comparator (B2), whereupon a signal (Q) appears, upon the entrance of an impulse (CL), at the Q-output of a flupflop (21), to whose D-input the signal (C) is conducted.

3. Watthout meter as recited in claim 2, characterized in that between successive signals (P, $\overline{P}$) a short signal (S) is generated in the circuit (CO).

4. The watthour meter as defined in claim 1 wherein the control circuit (CO) further includes a flipflop (21) having an input (D) connected to the output of the comparator, a clock terminal and a Q-output connected to the compensation circuit, said signal producing means comprising digital generator means (24) for generating said polarity reversing signals (P, P̄), a clock signal (CL) of predetermined duration applied to the clock terminal of the flipflop (21) and a short signal (S) between the polarity reversing signals said polarity reversing signals being of equal duration as multiples of said duration of the clock signal.

5. The watthour meter as recited in claim 4 wherein the compensation circuit (B3) includes a pair of switches (14,15) having reference voltage terminals ($U_R, U_R$); a pair of AND gates (17,18) having interconnected input terminals connected to the Q-output of the flipflop (21) and two separate inputs to which said polarity reversing signals (P,P̄) are conducted, said pair of switches of the compensation circuit further having a common terminal connected to the input resistor (20), a grounded switch (16) connected to said common terminal and a NOR gate (19) having a switch controlling output connected to the grounded switch (16) and a pair of inputs respectively connected to the Q-output of the flipflop (21) and receiving said short signal (S).

6. The watthour meter as recited in claim 1 wherein said sensor circuit ($S_H'$) includes identical circuit sections ($S_{HS}, S_{HR}, S_{HT}$) provided with the Hall sensor, the two pairs of switches and the second operational amplifier, said circuit sections having input terminals to which phase voltages are applied, the noninverting input of the second operational amplifier (IS) of one of the circuit sections ($S_{HS}$) being grounded with the output thereof being connected to the noninverting input of the second operational amplifier (IR) of a second of the circuit sections ($S_{HR}$) with the output thereof being connected to the noninverting input of the second opeational amplifier (IT) of a third of the circuit sections ($S_{HT}$) to which the integrator is connected.

7. The watthour meter as recited in claim 1 wherein said sensor circuit ($S_H''$) includes identical circuit sections ($S_{H1}, S_{H2} \ldots S_{HR}$), each provided with the Hall sensor, the two pairs of switches and the second operational amplifier, said input resistor (5) being connected in common to said circuit sections, the noninverting input of the second operational amplifier (1') of a first of the circuit sections being grounded and the Hall sensors being interconnected through the second operational amplifier with the output voltage $U_H$ being fed from the last of the circuit sections ($S_{HR}$) to the integrator.

8. The watthour meter as recited in claim 1, 6 or 7 wherein the comparator (B2') includes a follower amplifier (130) connected to the integrator, a third operational amplifier (132) arranged in a Schmitt trigger configuration having feedback resistors (134, 137) establishing threshold levels $U_{Hn}, U_{Hn}$) and signal controlled switches (135, 136) to which control signals Z1, Z2 from the control circuit are conducted.

9. the watthour meter as recited in claim 8 wherein the control circuit (CO') includes an AND gate (152) having a pair of inputs and an output, a multiplexer (C4) connected to one of the inputs of the AND gate, the other of the inputs receiving an inverted signal (C') from the comparator, a flipflop (154) having a D-input connected to the output of the AND gate, a clock input receiving a clock signal (CL) and a Q-output at which a Q-output signal $Q_1$ appears.

10. The watthour meter as recited in claim 9 wherein the compensation circuit includes a single reference voltage terminal ($U_R$), a reference voltage switch (114) connected to said reference voltage terminal, a grounding switch (116), means responsive to said Q-output signal ($Q_1$) of the flipflop (154) for alternatively controlling the reference voltage switch and the grounding switch and a follower amplifier (B3') operatively connecting the grounding switch to the coupling resistor (120).

11. The watthour meter as recited in claim 10 wherein the control circuit (CO') further includes a frequency comparing device (C1) having two comparators (191,192) respectively provided with a K-input, a F-input and a Z-output, a zero-detector (165) connected to said input terminal of the sensor circuit producing a zero voltage detection signal (N), inverting means connecting the zero-detector to the K-inputs of the frequency comparing device for inverting the zero voltage detection signal (N) applied thereto, a D-flipflop (156) connected to the F-input of one of the two comparators (192) applying a logic frequency signal (Q') thereto, a frequency divider (157) operatively connecting the D-flipflop (156) to the F-input of the other of the two comparators applying a frequency divided logic signal (Q") thereto, whereby at the Z-output of said other of the comparators (191) there appears one of the control signals (Z1) and at the Z-output of said one of the comparators (192) there appears another of the control signals (Z2), said control signals (Z1), (Z2) being both logic 0 when the logic frequency signal (Q') is lower in frequency than that of the zero voltage detection signal (N), and the one of the signals (Z1) at the Z-output of the other of the comparators (191) is logic 1 when the frequency of the logic frequency signal (Q') is higher than the frequency of the zero voltage detection signal (N) while the other of the control signals (Z2) at the K-output of said one of the comparators (192) turns to logic 1 when the frequency of the frequency divided logic signals (Q") exceeds the frequency of the zero voltage detection signal (N).

12. The watthour meter as recited in claim 11 wherein the control circuit (CO') includes a multiplexer (C3) having an output signal with a frequency equal to that of the polarity reversing signals, said multiplexer comprising first and second OR gates respectively having two inputs and an output, a pair of AND gates respectively having two inputs and an output, a third OR gate having inputs connected to the outputs of the AND gates and an output conducting the output signal at said frequency of the polarity reversing signals and a D-flipflop having a clock input connected to one of the inputs of one of said AND gates, a D input connected to the K output of one of the comparators (192) of the frequency comparing device (C1) and a Q output connected to one of the inputs of the outer of the AND gates, a signal inverter connecting said Q output of the D-flipflop to the other of the inputs of said one of the AND gates and a frequency divider (166) connected to the zero-detector (165) through the inverting means for supplying a frequency divided detection signal (N') to one of the inputs of the second OR gate, one of the inputs of the first OR gate being connected directly to the inverting means from which the zero voltage detection signal (N) is derived, the other inputs of the first and second OR gates being interconnected to receive the Q-output signal ($Q_1$) from the first mentioned flipflop (154) of the control circuit (CO'), whereby the frequency of the polarity reversing signals is equal in frequency to that of the frequency divider detection signal (N') when the other of the control signals Z2) is logic 0 or equal to the frequency of the zero voltage detection signal (N) when said other of the control signals (Z2) is logic 1.

13. The watthour mater as recited in claim 12 wherein said means (C5) producing polarity reversing signals (C5) comprises a pair of NOR gates (183, 184) respectively connected in series with a pair of inverters (185, 186 and 187, 188) to respectively form parallel chains from which said polarity reversing signals (P',P̄') are derived, each of said NOR gates having two inputs, one of which is interconnected with the chain associated with the other of the NOR gates, a third NOR gate having an output, the other of the inputs of one of said pair of NOR gates (184) being directly connected to the output of the third NOR gate (178) and an input signal inverter (182) connecting the other of the inputs of the other of said pair of NOR gates (183) to said multiplexer (C3).

14. The watthour as recited in claim 13, including polarity reversal detection means (D5) having an output terminal for shunting the capacitor (122) of the integrator (B1') in response to a polarity reversing voltage output thereof exceeding a threshold level, including an operational amplifier (141) having inverting and noninverting inputs and an output, a resistor (140) coupling the noninverting input of the operational amplifier to the integrator, a reference voltage terminal, a plurality of resistors (143, 144, 145) interconnected in series between said reference voltage terminal and the inverting input of the operational amplifier, switch controlling means (147, 148) for shunting said series connected resistors in response to the control signals (Z1, Z2) from the frequency comparing device (C1) to establish said threshold level and a D-flipflop (150) having a clock input and a Q output, and signal inverting means respectively coupling the operational amplifier to the clock input and the Q output to said output terminal of the polarity reversal detection means at which said short signal (S') appears, the integrator (B1') including switch means (117) connected to the clock input for defecting said shunting of the capacitor (122).

15. The watthour meter as recited in claim 14, including an exclusive OR gate (189) having a pair of inputs respectively connected to the output of the third NOR gate (178) of the multiplexer (C3) and the signal inverter connected to the Q output of the D-flipflop (150) of the polarity reversal detector (B5) and an output at which a polarity reversing reference signal (R) appears, and signal inverting means connected to said output of the exclusive OR gate for supply of an inverted polarity reference signal (R).

16. The watthour meter as recited in claim 15, wherein said control circuit (CO') further includes a frequency comparator (170) having a K input, an F input to which the Q output signal (Q1) is applied and an output (Z3), a D-flipflop (193) having a D input connected to said output of the frequency comparator and a Q output, a monoflop (169) having an output connected to the K input of the frequency comparator (170) and a second multiplexer (C4) including, a first AND gate having a pair of inputs respectively connected to the Q output of said D-flipflops (193) and the output of the third OR gate (178) of the first mentioned multiplexer (C3) and an output, second and third AND gates respectively having a pair of inputs and an output, the output of the second AND gate being connected to one of the inputs of the third AND gate, a signal inverter connecting one of the inputs of the second and-gate to the Q output of the D-flipflop (193), the other inputs of the second and third AND gates being respectively connected to the output of the OR gate (177) of the first mentioned multiplexer (C3) and the output of the monoflap (169) and a NOR gate (175) of the second multiplexer from which an output thereof extends, having a pair of inputs respectively connected to the outputs of the first and second AND gates.

17. The watthour meter as recited in claim 16 wherein the compensation circuit (B2') includes an amplifier (132) having an inverting input connected to one of the terminals of the capacitor (122) of the integrator (B1') and a noninverting input, a following amplifier (130) interconnecting the other of the terminals of the capacitor (122) of the integrator to the noninverting input of the amplifier (132) and a grounded compensation capacitor (127) connected to said inverting input of the amplifier (132).

18. In a watthour meter including a sensor from which a voltage signal input proportional to energy consumed is derived and converter means connected to the sensor for conversion of said voltage signal input to a frequency signal output, said converter means having an inherently unstable passive element, means for maintaining substantial linearity between the voltage signal input and the frequency signal output, comprising control means operatively connected to the converter means for periodically generating polarity reversing signals, switching means operatively connecting the control means to the sensor for reversing said voltage signal input in polarity in response to said polarity reversing signals and switch controlled compensating means operatively connecting the control means to the converter means for polarity reversal of voltage across said passive element in synchronous relation to the polarity reversing signals causing cancellation of opposing error producing effects respectively arising from instability of the passive element during said conversion and disturbance of the sensor by said polarity reversal of the voltage signal input.

* * * * *